US008891292B2

(12) United States Patent
Wang et al.

(10) Patent No.: US 8,891,292 B2
(45) Date of Patent: Nov. 18, 2014

(54) MAGNETORESISTIVE LAYER STRUCTURE WITH VOLTAGE-INDUCED SWITCHING AND LOGIC CELL APPLICATION

(71) Applicant: Avalanche Technology Inc., Fremont, CA (US)

(72) Inventors: Zihui Wang, Fremont, CA (US);
Yuchen Zhou, San Jose, CA (US);
Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/011,484

(22) Filed: Aug. 27, 2013

(65) Prior Publication Data

US 2014/0169083 A1    Jun. 19, 2014

Related U.S. Application Data

(60) Provisional application No. 61/739,716, filed on Dec. 19, 2012.

(51) Int. Cl.
*G11C 11/00* (2006.01)
*H01L 43/02* (2006.01)
*G11C 11/16* (2006.01)

(52) U.S. Cl.
CPC .............. *H01L 43/02* (2013.01); *G11C 11/161* (2013.01)
USPC .......................................... 365/158; 365/173

(58) Field of Classification Search
CPC ............................... G11C 11/16; G11C 11/161
USPC ........................................................ 365/158
See application file for complete search history.

(56) References Cited

U.S. PATENT DOCUMENTS

| | | | | |
|---|---|---|---|---|
| 6,954,374 | B2 * | 10/2005 | Hidaka | 365/171 |
| 7,054,186 | B2 * | 5/2006 | Iwata | 365/158 |
| 7,233,537 | B2 * | 6/2007 | Tanizaki et al. | 365/209 |
| 2011/0303998 | A1 | 12/2011 | Ranjan et al. | |

OTHER PUBLICATIONS

Wei-Gang Wang, Mingen Li, Stephen Hageman and C. L. Chien, "Electric-field-assisted switching in magnetic tunnel junctions", Nature Materials vol. 11, 64-68 (2012).
S. Ikeda, et.al., "A perpendicular-anisotropy CoFeB-MgO magnetic tunnel junction", Nature Materials vol. 9, 721-724 (2010).
T. Aoki, et.al., "Fabrication of MgO-based magnetic tunnel junctions for subnanosecond spin transfer switching", Journal of Physics: Conference Series 266, 012086 (2011).

(Continued)

*Primary Examiner* — Michael Tran
(74) *Attorney, Agent, or Firm* — G. Marlin Knight; Bing K. Yen

(57) ABSTRACT

Embodiments of the invention include a voltage-switching MTJ cell structure that includes two sub-MTJs in series. Each free layer can be switched independently from the other. Each sub-MTJ has a high and a low resistance state and the MTJ cell structure can have three or four discrete resistance states. By taking advantage of the electrical field induced anisotropy combining with the spin torque effect, free layer-1 and free layer-2 can be controlled individually by voltage pulses having selected sign (polarity) and amplitude characteristics. The MTJ cell structure can be used as a fully functional logic cell with two input bit values corresponding to the high or low resistance of the two sub-MTJ structures and the output of a logical operation, e.g. an XOR function, determined by the resistance state of each MTJ cell.

17 Claims, 10 Drawing Sheets

(56) References Cited

OTHER PUBLICATIONS

P. Padhan, et.al.,"Frequency-dependent magnetoresistance and magnetocapacitance", Appl. Phys. Lett. 90, 142105 (2007).

J Wrona, et.al.,"Low resistance magnetic tunnel junctions with MgO wedgebarrier", Journal of Physics: Conference Series 200, 052032 (2010).

Alzate, et al., "Voltage-Induced Switching of Nanoscale Magnetic Tunnel Junctions", IEDM conference proceedings, 12-681, (2012).

* cited by examiner

Voltage induced switching of MTJ

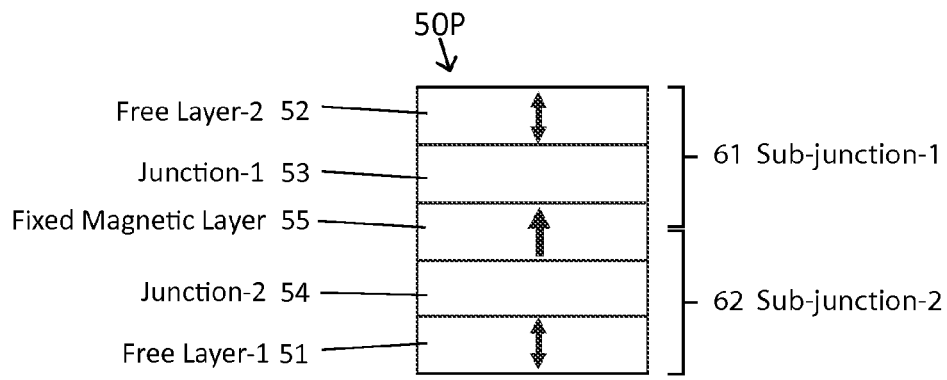

Free Layer-2  52
Junction-1  53
Fixed Magnetic Layer  55
Junction-2  54
Free Layer-1  51

61 Sub-junction-1
62 Sub-junction-2

|  | State-1<br>(Both = Low) | State-2<br>(High + Low) |  | State-3<br>(Both = High) |
|---|---|---|---|---|
| Sub-junction-1 State | R-low | R-low | R-high | R-high |
| Sub-junction-2 State | R-low | R-high | R-low | R-high |
| Total Resistance | 2 * R-low | R-high+R-low |  | 2 * R-high |

Assuming R-low and R-high are equal for each sub-junction.

FIG. 11B

|  | State-1 | State-2 | State-3 | State-4 |
|---|---|---|---|---|
| Sub-junction-1 State | R-low-1 | R-low-1 | R-high-1 | R-high-1 |
| Sub-junction-2 State | R-low-2 | R-high-2 | R-low-2 | R-high-2 |
| Total Resistance | R-low-1<br>+<br>R-low-2 | R-low-1<br>+<br>R-high-2 | R-high-1<br>+<br>R-low-2 | R-high-1<br>+<br>R-high-2 |

Assuming R-low and R-high are different (not equal) for each sub-junction.

FIG. 11C

MAGNETORESISTIVE LAYER STRUCTURE WITH VOLTAGE-INDUCED SWITCHING AND LOGIC CELL APPLICATION

CROSS REFERENCE TO RELATED APPLICATIONS

Provisional Application 61/739,716 filed Dec. 19, 2012 is included by reference herein and benefit of the priority date is hereby claimed. The subject matter of this application is related to commonly assigned co-pending applications bearing Ser. No. 13/402,123, filed 22 Feb. 2012 and Ser. No. 13/774,801, filed 22 Feb. 2013.

FIELD OF THE INVENTION

The present invention relates to the design and use of magnetoresistive random access memory (MRAM) cells that include magnetic tunnel junctions (MTJ) memory elements and more particularly to cells that include more than one free layer that are usable as a multiple level cell (MLC) or logic device.

BACKGROUND OF THE INVENTION

A typical STT-MRAM (spin transfer torque magnetic random access memory) MTJ (magnetic tunnel junction) device has a pinned reference layer whose magnetization is fixed in certain direction by either intrinsic anisotropy field, or through an exchange coupling field from an adjacent magnetic layer. It also has a switchable free layer, whose magnetization direction can be switched in either of two directions relative to that of the reference layer by an electric current flowing between the reference layer and free layer through an junction layer, typically an oxide of Mg, Al and Ti, or a metallic layer of Cu, Au, or Ag. The different relative angles between free layer and reference layer magnetization directions gives different resistance levels through the MTJ stack. Thus, by switching the free layer magnetization directions with the applied electric current, an STT-MRAM can be switched into high and low resistance states. The low resistance state occurs when the magnetization orientation of the two ferromagnetic layers is substantially parallel and the high resistance state occurs when they are anti-parallel. Therefore, the cells have two stable states that allow the cells to serve as non-volatile memory elements.

Reading the state of the cell is achieved by detecting whether the electrical resistance of the cell is in the high or low state. Writing the cells requires a sufficiently high DC current flowing in the direction through the MTJ stack between the top and bottom metal contacts to induce a spin transfer torque (STT) that orients (switches) the free layer into the desired direction. The amount of current needed to write the cells is higher than the current needed during the read process, so that a read operation does not change the state of the cell.

A study by Wang, et al. on perpendicular MTJ shows that the perpendicular anisotropy of magnetic layers in MgO based MTJ structures can be changed by the voltage applied to the magnetic layers. See Wei-Gang Wang, et al., "Electric-field-assisted switching in magnetic tunnel junctions", Nature Materials Vol. 11, 64-68 (2012). Wang, et al. used an example MTJ layer structure (which is illustrated in FIG. 1 herein) of bottom magnetic layer 43 of CoFeB (1.3 nm), MgO layer 42 (1.4 nm), and top magnetic layer 41 of CoFeB (1.6 nm). In the test setup as shown a small positive DC electric potential is applied to the MTJ cell to drive electrons into the bottom magnetic layer. When MgO layer 42 is thick enough and resistance across the MgO junction is high enough, the current density through the MgO junction will be low. In this case, the two magnetic layers adjacent to the MgO layer form a capacitor across the MgO layer, which is fundamentally the same as a classic parallel-plate capacitor with the MgO layer as the dielectric between the parallel plates. When a voltage is applied to the MgO junction, electrical charges will accumulate in the two magnetic layers, which is governed by the capacitor equation of $Q=C \times V$, where Q is the net charge, C the capacitance and V the applied voltage. The applied positive voltage as shown in FIG. 1 causes the top magnetic layer to have a positive potential, i.e. electron depletion at the top layer's interface to the MgO layer and results in the flow of electrons toward the positive potential. Wang's graph (reproduced in FIG. 2 herein) shows the coercivity field Hc for the top and bottom layers as a function of the electric field. The perpendicular anisotropy is reflected by the measured coercivity field Hc. With increasing applied voltage and electron depletion at the top layer's interface to the MgO layer, the top magnetic layer shows increased perpendicular anisotropy. For the magnetic layer with positive potential, the positive charges at its interface with MgO are basically vacancies of conductive electrons that are depleted by the applied voltage. The layer that has negative potential (the bottom layer in this example) and, therefore, conductive electron concentration at the layer's interface to MgO, shows decreased perpendicular anisotropy.

The fundamental difference between an MgO junction acting as a capacitor and a standard capacitor is that the electrons at the magnetic layers interface also induce magnetic anisotropy in the magnetic layers. The cited Wang, et al. and Alzate, et al. articles show surface perpendicular anisotropy of CoFeB layers on the sides of the MgO layer is intrinsically due to the broken-symmetry of the interface CoFe lattice of the CoFeB layer facing the MgO layer. See J. G. Alzate, et al., "Voltage-Induced Switching of Nanoscale Magnetic Tunnel Junctions", IEDM digest, San Francisco, December 2012. FIGS. 4A and 4B illustrate the voltage-induced switching principle describe by Alzate, et al. In a perfectly symmetric and continuous lattice of CoFe, the electron-to-electron spin exchange coupling between the un-paired 3d electrons, which are also the conductive electrons, of Co and Fe atoms, cancel out each other's effect and produce zero anisotropy energy in a symmetric and continuous lattice. However, at the interface of CoFeB layer and MgO layer, the CoFeB layer's interface is actually CoFe facing MgO. MgO breaks the symmetry of the CoFe lattice, such that the 3d electrons of Co and Fe atoms at the interface lose their cancellation-counter-part and produce a net anisotropy energy and an effective anisotropy field perpendicular to the interface plane. Thus, under these conditions the originally soft magnetic CoFeB film can exhibit strong perpendicular anisotropy at the MgO interface and show hard magnetic behavior.

Wang, et al. show that with applied voltage, the magnetic layer subjected to a positive potential, i.e. electron depletion at the layer's interface to MgO, shows increased perpendicular anisotropy. The magnetic layer that experiences a negative potential, i.e. electron concentration at the layer's interface to MgO, shows decreased perpendicular anisotropy. A possible cause of such behavior is that the magnetic layer having increased electrons will have more conductive electrons filling into the 3d-band of the interface CoFe lattice and reduced unpaired 3d-electron population; thus making the broken-symmetry induced surface perpendicular anisotropy weaker and making the magnetic layer magnetically softer. For the magnetic layer having 3d-electrons depleted, electrons will be first depleted from paired 3d-electrons due to Hund's Rules. More 3d-electrons become unpaired, which enhances the surface perpendicular anisotropy and makes the layer harder to switch by external field or STT.

The voltage-induced perpendicular anisotropy effect can be used to switch MTJ by combination with spin transfer torque effect. Using an in-plane MTJ, for example, by applying a positive voltage across MTJ, which depletes electron from the free layer/MgO interface, a strong perpendicular anisotropy on the free layer will be induced, and therefore, reduce its coercivity and make it easier to switch. While the coercivity is reduced, the free layer magnetization can be set/switched with a smaller magnetic field than is needed under static conditions. It has been shown that this small magnetic field can be replaced by a field-like STT generated by the current flowing through the MTJ. A field-like STT will tend to set the MTJ to anti-parallel direction with a low applied voltage. At high applied voltage, the field-like STT will switch its direction and tend to set the MTJ to parallel direction. Therefore, the MTJ can be selectively switched in either direction with a voltage applied in a unipolar direction depending on the pulse amplitude.

SUMMARY OF THE INVENTION

Embodiments of the invention include a voltage-switching MTJ cell structure that includes two free magnetic layers and one fixed magnetic layer separated by junction layers, which will also be generally referred to a magnetoresistive logic cell (MRLC). Both perpendicular and in-plane anisotropy embodiments are described. Embodiments of the MTJ cell structure in effect include two MTJs, which will be called sub-MTJs) in series that each include a free layer, a junction layer and the shared fixed magnetic layer. Although the preferred embodiments use a shared fixed layer, alternative embodiments that use two separate fixed layers instead of a shared fixed magnetic layer are possible. Each free layer can be switched independently from the other. Each sub-MTJ has a high and a low resistance state. The overall resistance of the MTJ cell structure is the combination of the resistance of the two sub-MTJs. If the sub-MTJs have different high and low resistance values, the MTJ cell structure can have four discrete resistance states. If the sub-MTJs have equal high and low resistance values, the MTJ structure will have only three discrete resistance states.

Embodiments of the invention also include a method to set the magnetization direction, i.e. write or program, either free layer-1 or free layer-2 independently and deterministically in either magnetization direction. By taking advantage of the electrical field induced anisotropy combining with the spin torque effect, free layer-1 and free layer-2 can be controlled individually by voltage pulses having selected sign (polarity) and amplitude characteristics. The sign of the voltage pulse determines the direction of electron flow and, therefore, which of the two free layers will have an accumulation of electrons and which one will have a depletion of electrons. For example, in a perpendicular anisotropy embodiment of the invention, application of a voltage pulse will cause one of the free layers to have reduced perpendicular anisotropy, due to the accumulation of electrons at the junction interface, making it easier to switch. At the same time, the other free layer will have enhanced perpendicular anisotropy, due to the depletion of electrons at the junction interface, making it harder to switch. Temporarily creating a differential in the anisotropies, allows a properly selected pulse to switch the magnetization of one free layer while leaving the other one unchanged. The amplitude of the pulse can be selected to set the magnetization of the targeted free layer to either parallel or anti-parallel the magnetization of the fixed layer. For example, in an embodiment a relatively low amplitude positive voltage pulse can be used to set free layer-1 to the anti-parallel direction with respect to the fixed layer. Similarly, a relatively high amplitude negative voltage pulse can be used to set free layer-2 to the parallel direction with respect to the fixed layer. Thus, in embodiments of the invention a set of four selected types of pulses can be used to program the MTJ cell into the four available states. The three or four resistance-state MTJ structure can be used as a fully functional logic cell, which usually requires a much more complicated and bulky circuitry if realized entirely by conventional CMOS circuits. Input circuitry writes two input bit values into an MTJ cell by setting the high or low resistance of first and second sub-MTJ structures. Output circuitry determines a result of a logical operation by determining a current resistance state of each MTJ cell, which is mapped to a bit value. For example, in an embodiment using three resistance states of the MTJ structure, bit values (0,1) are assigned to first and second sub-junction resistance states (low, high) as inputs and the output bit value is decoded from the total resistance. The 3 total resistance states (low+low; low+high; high+high) are mapped into a single bit value. For example, one possible mapping is:

state-1 (low+low)="0"
state-2 (low+high)="1"
state-3 (high+high)="0"

Given these encoding assumptions, writing a "0" to both free layers will result in the MTJ structure being in state-1 and yielding a logical output value of "0". The four possible input combinations and the corresponding output for this example achieve an XOR function. Other encodings and mappings can be used to achieve other logical functions using the MTJ structures according to the invention.

BRIEF DESCRIPTION OF THE FIGURES

FIG. 11A illustrates the sub-junctions in an MTJ layer structure embodiment of the invention.

FIG. 11B illustrates the three resistance states in an MTJ layer structure embodiment of the invention in which the sub-junctions have high and low resistance states that are equal.

FIG. 11C illustrates the four resistance states in an MTJ layer structure embodiment of the invention in which the sub-junctions have high and low resistance states that are not equal.

DETAILED DESCRIPTION OF THE INVENTION

In the following description of the embodiments of the invention, reference is made to the accompanying drawings that form a part hereof. The figures discussed herein are not drawn to scale and do not indicate actual or relative sizes.

The following table shows a comparison of experimental data obtained by the inventors of the present application for embodiments of the invention versus voltage switching data published by Alzate, et al. 2012 cited above for prior art MTJ. The voltage switching MTJ shows a much smaller switching current and therefore needs very small power for cell operation, making it preferred in certain applications.

TABLE 1

Voltage Switching Data

|  | Voltage Switching MTJ (based on data published by Alzate, et al. 2012) | Spin-torque MTJ (based on authors' typical device data) |
| --- | --- | --- |
| $R_{low}$ | 100k Ohm | 2k Ohm |
| $R_{high}$ | 180k Ohm | 4k Ohm |
| TMR | 80% | 100% |
| Switching Current | <10 µA | ~100 µA |
| Switching Voltage | 400 mV-1 V | 300-500 mV |

Figure 5:
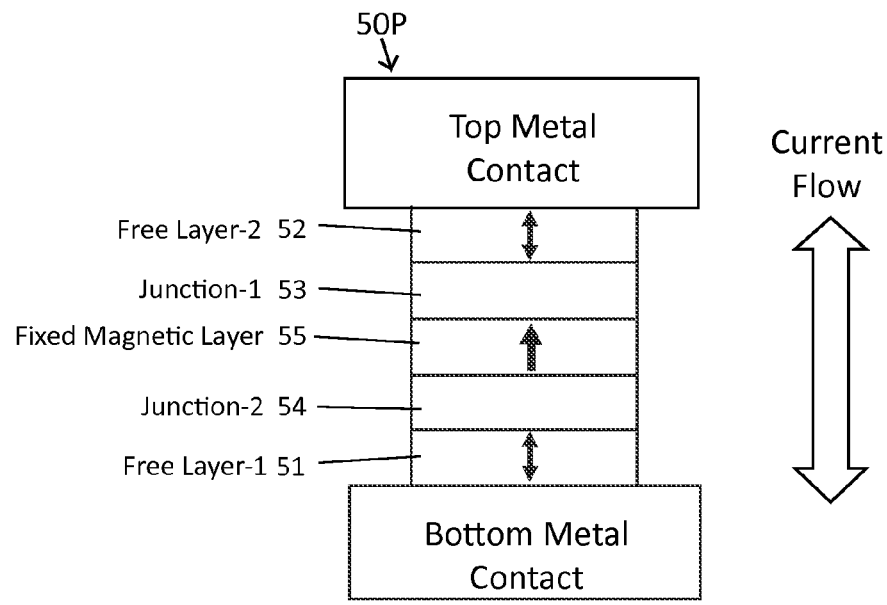
FIG. 5 is an illustration of an MTJ layer structure embodiment of the invention with perpendicular anisotropy.

FIG. 5 is an illustration of an MTJ layer structure embodiment 50P of the invention with perpendicular anisotropy. MTJ 50P includes layers 51-55. Current flow is between top and bottom contacts. Magnetic layers 51, 52, 55 have magnetization anisotropy perpendicular to the film plane. Magnetic free layer-1 51 serves as data storage layer-1. Magnetic layer 51 can include any of the following elements: Co, Fe, B, Ta, Ti, Ni, Pt, Pd, Cr, Cu, Mg, O, Hf, N, Cr, Mn, Zr, Ir, Si. A multi-layer structure can also be used for magnetic layer 51 that includes laminated magnetic layers and non-magnetic layers, where the magnetic layer(s) can include any of the following elements: Co, Fe, B, Ta, Ti, Ni, Pt, Pd, Cr, Cu, Mg, O, Hf, N, Cr, Mn, Zr, Ir, Si; and where nonmagnetic layer(s) can include any of the following elements: Pt, Pd, Ru, Ta, Ti, Cr, Cu, Mg, Hf, Cr, Mn, Zr, Ir, Si, C, and can also be an oxide of Mg, Al, Zn, Ta, Ti, Cu, Cr.

Magnetic free layer-2 52 need not be the same material as magnetic layers 51 or 55 but the same set of element/structure choices as given above for layer 51 apply. Junction layer-1 53 should be an oxide layer of Mg, Al, Zn, Ta, Ti, Cu, Cr that give a RA of a minimum of 2 Ωµm². Junction layer-2 54 should be an oxide layer of Mg, Al, Zn, Ta, Ti, Cu, Cr that give a RA of a minimum of 2 Ωµm². Either layer 51 or layer 52, or both of them, can contain multi-ferroic material or show multi-ferroic behavior.

Fixed Magnetic layer 55 need not be the same material as magnetic layers 51 or 52, but the same set of element/structure choices as described above for layer 51 apply. Each of the above mentioned free magnetic layers 51, 52 and/or fixed magnetic layer 55 can be a synthetic or multiple layer structure.

Figure 6:
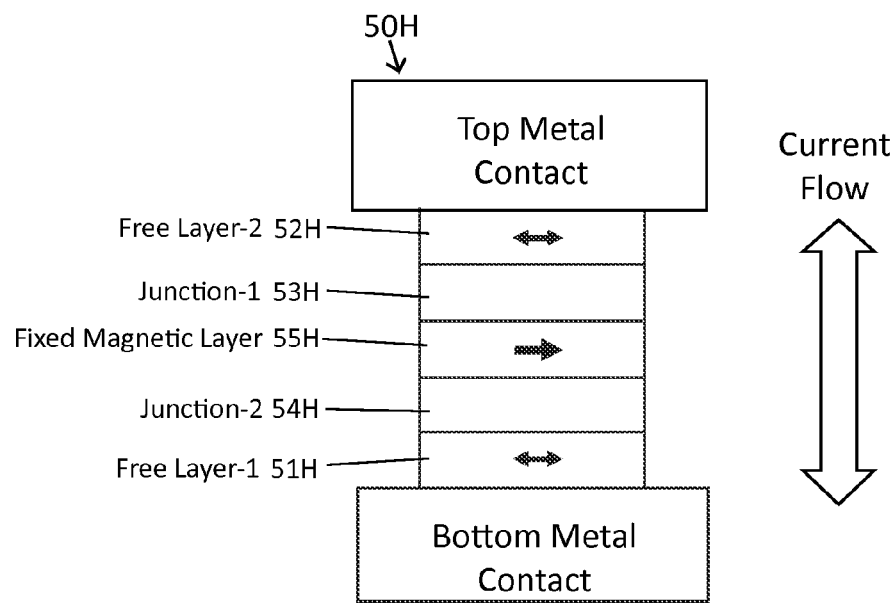
FIG. 6 is an illustration of an MTJ layer structure embodiment of the invention with in-plane anisotropy.

FIG. 6 is an illustration of an MTJ layer structure embodiment 50H of the invention with in-plane anisotropy. MTJ 50H includes layers 51H-55H. Magnetic layers 51H, 52H, 55H have magnetization in-plane the film plane, but otherwise the above discussion applies to the layers, materials and structures in MTJ layer structure embodiment 50H.

Figure 7:
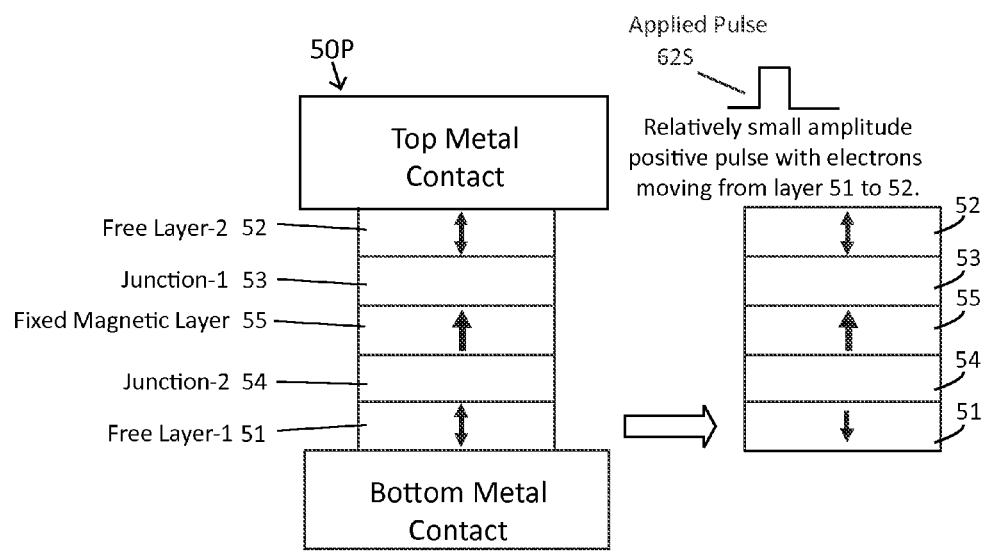
FIGS. 7 and 8 illustrate a method of switching the magnetization of free layer-1 in an MTJ layer structure embodiment of the invention with perpendicular anisotropy.
Figure 8:
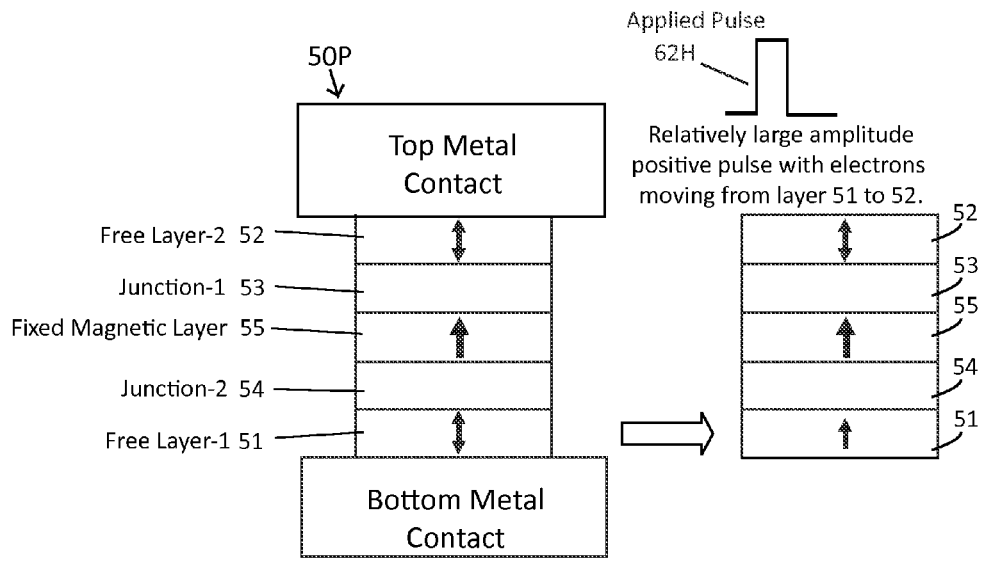

FIGS. 7 and 8 illustrate a method of switching the magnetization of free layer-1 51 in an MTJ layer structure embodiment 50P of the invention with perpendicular anisotropy. Selectively switching only the magnetization of free layer-1 51 is achieved by applying a selected voltage pulse 62S or 62H across the contacts. The double-headed arrow in free magnetic layer 51 indicates that its initial magnetization direction can be either up or down. The final magnetization direction of layer 51 is set relative to magnetization direction of fixed magnetic layer 55. In this example fixed magnetic layer 55 is shown as having magnetization direction pointing up, but an embodiment with fixed layer 55 being magnetized in the down direction will function according to principles described herein with appropriate adjustments to the directions of the free layers.

As illustrated in FIG. 7, application of voltage pulse 62S, which has relatively small amplitude, results in setting the magnetization direction of free layer 51 in the anti-parallel direction to the fixed layer 55. In the case shown in FIG. 7, this results in layer 51 being set in the down direction as shown. If alternatively the fixed layer was magnetized in the down direction, then the result would be that layer 51 would be set to the up direction by pulse 62S.

The voltage-induced switching principles discussed above apply to the structure 50P when the selected relatively small voltage pulse 62S is applied. The exact parameters for the amplitude and duration of the pulses 62S and 62H can be determined empirically for a given layer structure such as 50P. The sign (polarity) of the voltage pulses 62S, 62H is selected to cause electrons to flow from free layer-1 51 to free layer-2. Accordingly current flow is from the top contact down, i.e. in the opposite direction to electron flow and the voltage is positive.

The result of applying pulse 62S is that the coercivity of free magnetic layer-2 52 is temporarily enhanced and therefore its magnetization direction is more stable and harder to switch. However, the coercivity of free magnetic layer-1 51 is temporarily reduced, making it is easier to switch. The final result is that free layer-1 51 switches if necessary to achieve the antiparallel direction with the fixed layer, but free layer-2 52 does not switch. Thus, free layer-2 52 remains in its initial magnetization direction, which can be up or down, after the pulse 62S is applied.

Similarly, applying a selected large amplitude pulse 62H will switch the free layer-1 51 to the parallel direction in relation to the fixed layer 55 as illustrated in FIG. 8, while leaving the state of free layer-2 52 unchanged.

Figure 9:
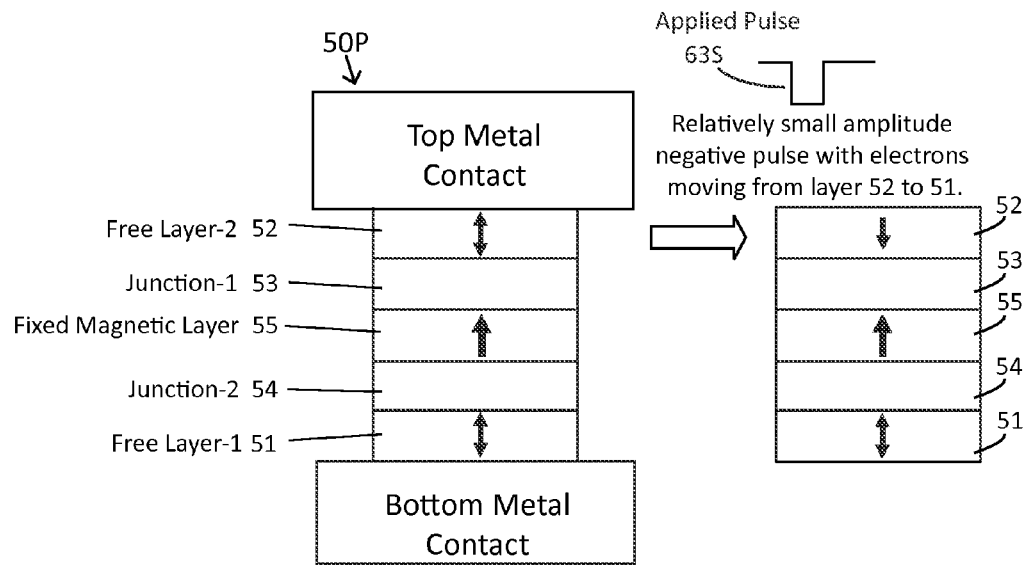
FIGS. 9 and 10 illustrate a method of switching the magnetization of free layer-2 in an MTJ layer structure embodiment of the invention with perpendicular anisotropy.
Figure 10:
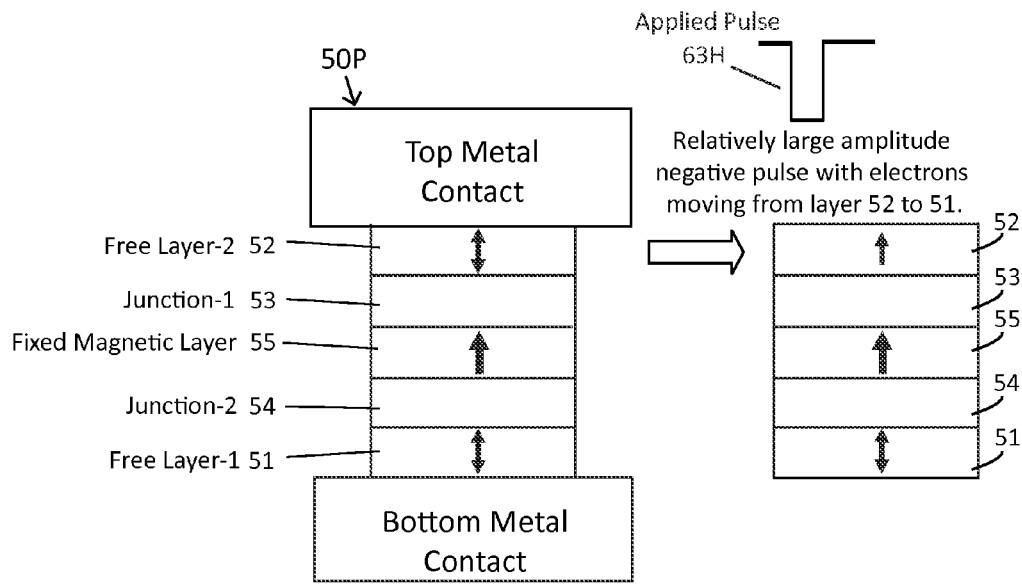

FIGS. 9 and 10 illustrate a method of switching the magnetization of free layer-2 52 in the MTJ layer structure embodiment 50P of the invention. Selectively switching only the magnetization of free layer-2 52 is achieved by applying a selected voltage pulse 63S or 63H across the contacts. The exact parameters for the amplitude and duration of the pulses 63S and 63H can be determined empirically for a given layer structure such as 50P. In this case the voltage of the pulses is negative to cause electrons to flow from free layer-2 52 to free layer-1 51. Accordingly current flow is from the bottom contact up, i.e. in the opposite direction to electron flow. Selectively switching only free layer-2 52 is achieved by using electron flow to increase the coercivity of free layer-1 making it temporarily harder to switch. At the same time the coercivity of free layer-2 52 is reduced making it easier to switch. Applying a relatively small amplitude negative pulse switches the free layer-2 52 to parallel the magnetization direction of the fixed layer 55. Applying a large amplitude negative pulse switches the free layer-2 to anti-parallel the magnetization direction of the fixed layer.

FIG. 11A illustrates the sub-junctions 61, 62 in an MTJ layer structure embodiment of the invention. FIG. 11B illustrates the three resistance states in an MTJ layer structure embodiment of the invention in which the sub-junctions 61, 62 have high (R-high) and low (R-low) resistance states that are equal. For this embodiment state-1 as shown occurs when both sub-junction-1 61 and sub-junction-2 62 are in the low resistance state R-low. Accordingly the total resistance for the MTJ layer structure 50P is the arithmetic sum of the two sub-junction resistances, which in this case is 2*R-low. Similarly state-3 occurs when both sub-junction-1 61 and sub-junction-2 62 are in the high resistance state R-high, which gives a total resistance of 2*R-high for the structure. State-2 occurs when the sub-junctions are in opposite resistance states, i.e., one having R-high and the other having R-low. Thus, state-2 has a total resistance of R-high+R-low.

FIG. 11C illustrates the four resistance states in an MTJ layer structure embodiment of the invention in which the sub-junctions have high and low resistance states that are not equal. In this case there are two different low resistance values (R-low-1 and R-low-2) and two different high resistance values (R-high-1 and R-high-2). As shown in FIG. 11C, state-1 for this case occurs when both sub-junctions are in their low resistance states, yielding a total resistance of R-low-1+R-low-2. State-2 has sub-junction-1 in the low state and sub-junction-2 in the high state yielding a total resistance of R-low-1+R-high-2. Similarly state-3 has sub-junction-1 in the high state and sub-junction-2 in the low state yielding a total resistance of R-high-1+R-low-2. State-4 has a total resistance of R-high-1+R-high-2, which occurs when both sub-junctions are in the high resistance state. The 4 resistance levels need to be well separated to allow for enough sensing margin as required by the sensing circuit.

The three (or four) resistance states of the MTJ structure can be used as a logic cell with bit values being written to the free layers to set the resistance of the sub-junctions and the logic operation result being read as the total resistance of the structure. In an embodiment using a three resistance states of the MTJ structure, bit values are assigned to sub-junction states as inputs and the output bit value is encoded in the total resistance. In the following example, setting a sub-junction to R-low is defined as writing an input of "0" and setting a sub-junction to R-high is defined as writing an input of "1". For the three state output case as defined in FIG. 11B, the mapping in this example is:

state-1 (2*R-low)="0"
state-2 (R-high+R-low)="1"
state-3 (2*R-high)="0"

Given these encoding assumptions, writing a "0" to both free layers will result in the MTJ structure being in state-1 and yielding a logical output value of "0". The four possible input combinations and the corresponding output are given in the table below:

TABLE 1

Example of possible input and output state mapping for 3-state device achieving a logical XOR function.

|  | State-1 | State-2 | State-2 | State-3 |
|---|---|---|---|---|
| Free Layer 1 | 0 | 1 | 0 | 1 |
| Free Layer 2 | 0 | 0 | 1 | 1 |

TABLE 1-continued

Example of possible input and output state mapping for 3-state device achieving a logical XOR function.

|  | State-1 | State-2 | State-2 | State-3 |
|---|---|---|---|---|
| Output (Total Resistance) | 0 (2 * R-low) | 1 (R-high + R-low) | 1 (R-low + R-high) | 0 (2 * R-high) |

In another embodiment, the output mapping can be inverted so that state-1 and state-3 correspond to output value "1" and state-2 is "0". Given this mapping the logical function becomes XNOR. A four state embodiment can be made to function in essentially the same manner as the 3-state embodiment.

Figure 12A:
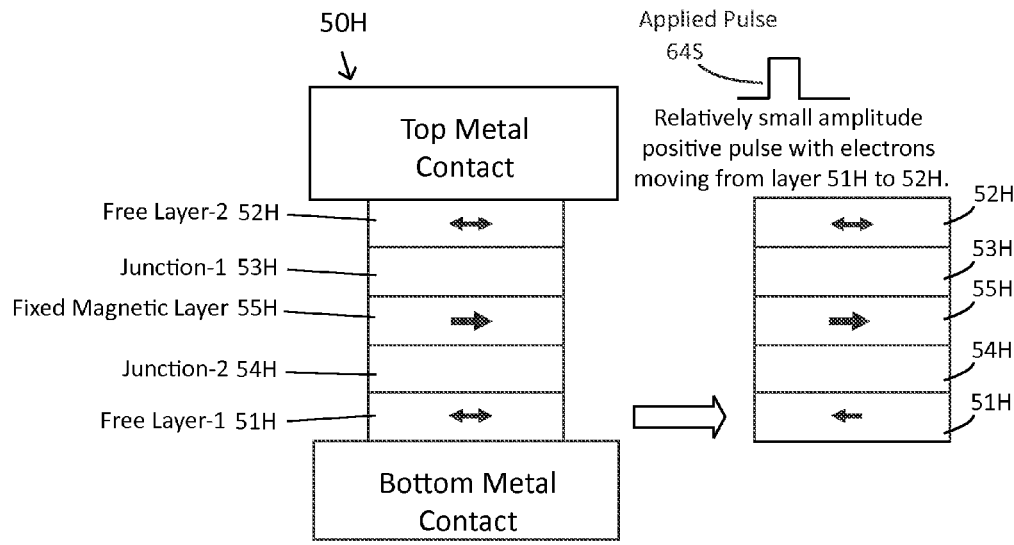
FIGS. 12A and 12B illustrate a method of switching the magnetization of free layer-1 in an MTJ layer structure embodiment of the invention with in-plane anisotropy.
Figure 12B:
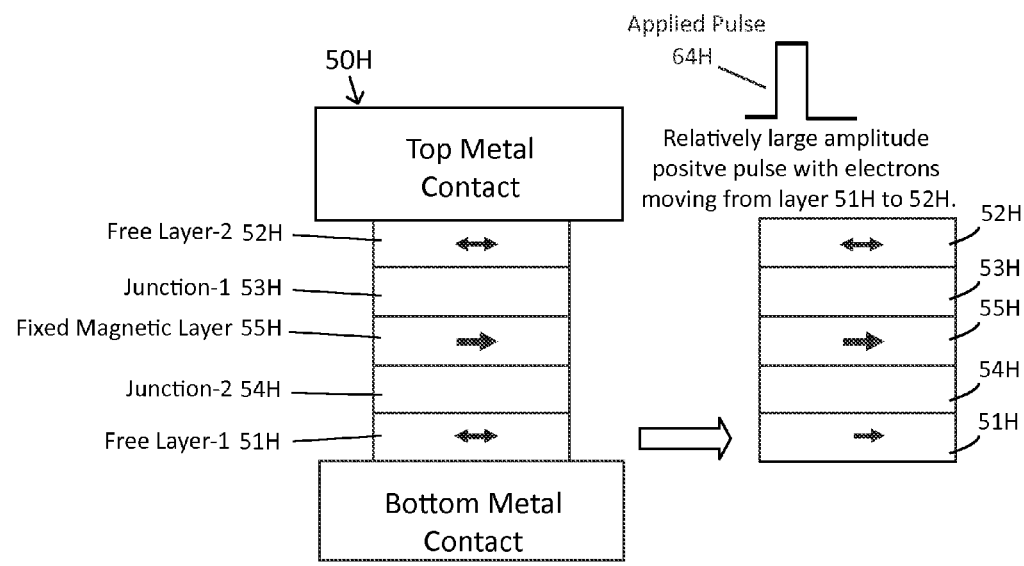

The in-plane embodiments of the invention can be switched using similar switching scheme as described above for the perpendicular embodiments. The 3 or 4 resistance state-MTJ structure can also be realized with in-plane MTJs. FIGS. 12A and 12B illustrate a method of switching the magnetization of free layer-1 51H in an MTJ layer structure embodiment 50H of the invention with in-plane anisotropy. Selectively switching free layer-1 51H only is achieved by applying a positive voltage pulse which causes electrons to move from free layer-1 51H to free layer-2 52H, the coercivity of layer 52H is enhanced therefore it is more stable and harder to switch. At the same time the coercivity of layer 51H is reduced therefore it is easier to switch. Applying a relatively small amplitude positive pulse 64S will switch the free layer-1 51H to the anti-parallel direction with respect to fixed magnetic layer 55H as illustrated in FIG. 12A. Applying a relatively large amplitude positive pulse 64H will cause the free layer-1 51H to switch to parallel the magnetization direction of fixed magnetic layer 55H as illustrated in FIG. 12B.

Figure 1:
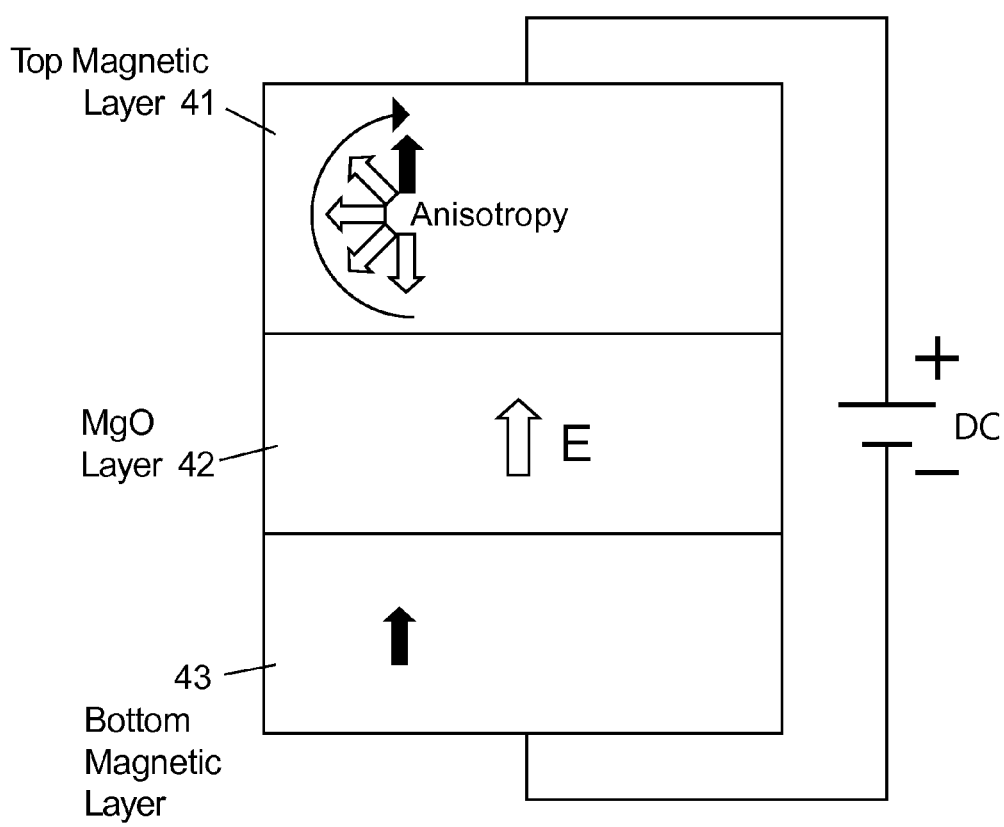
FIG. 1 is an illustration of an MTJ layer structure used in a prior art experiment.
Figure 2:
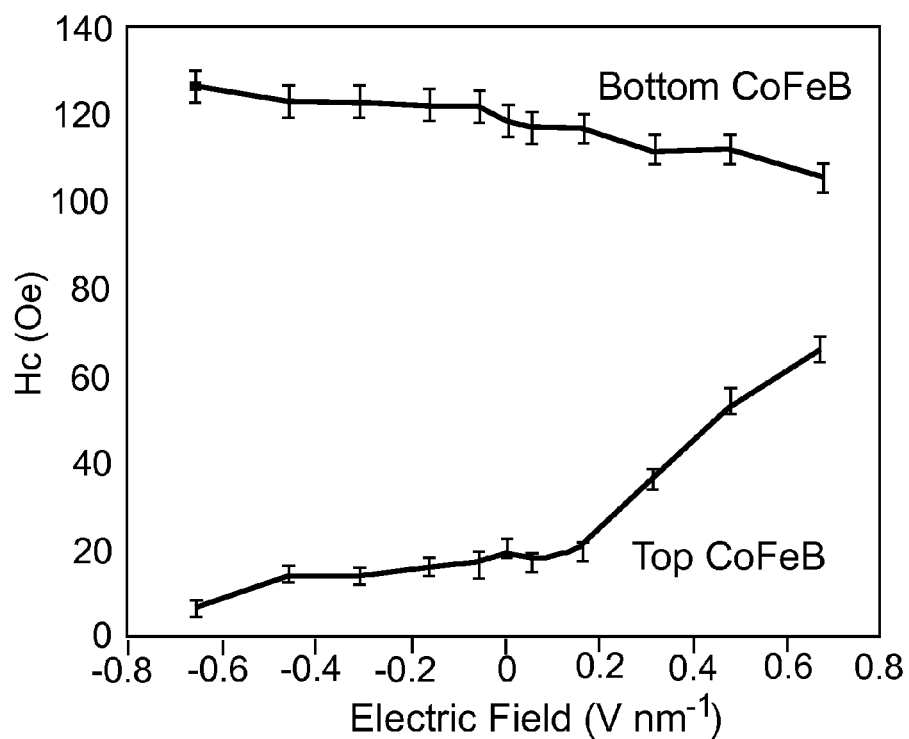
FIG. 2 is a graph of the results of a prior art experiment using the MTJ layer structure of FIG. 1.
Figure 3A:
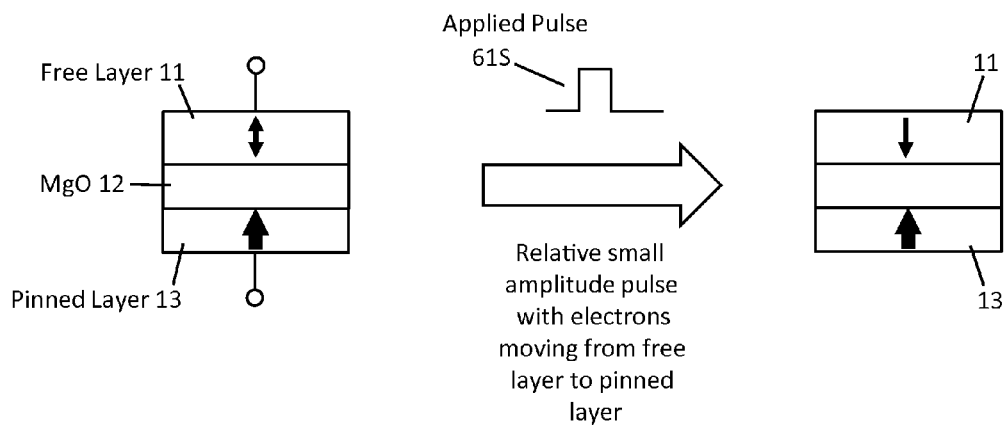
FIGS. 3A and 3B illustrate the voltage-induced switching principle used in the prior art.
Figure 3B:
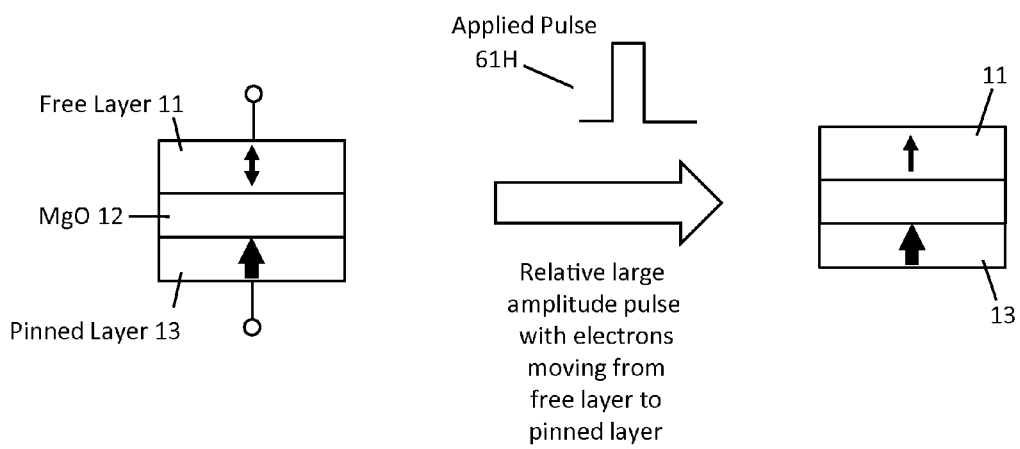
Figure 4A:
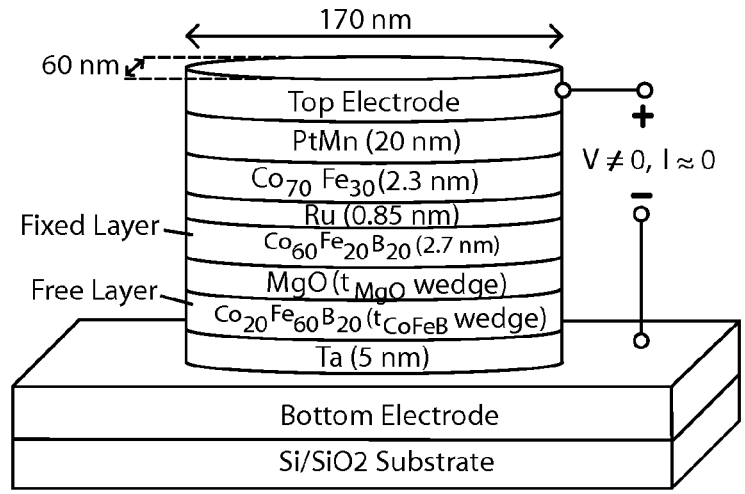
FIGS. 4A and 4B illustrate the voltage-induced switching principle used in prior art.
Figure 4B:
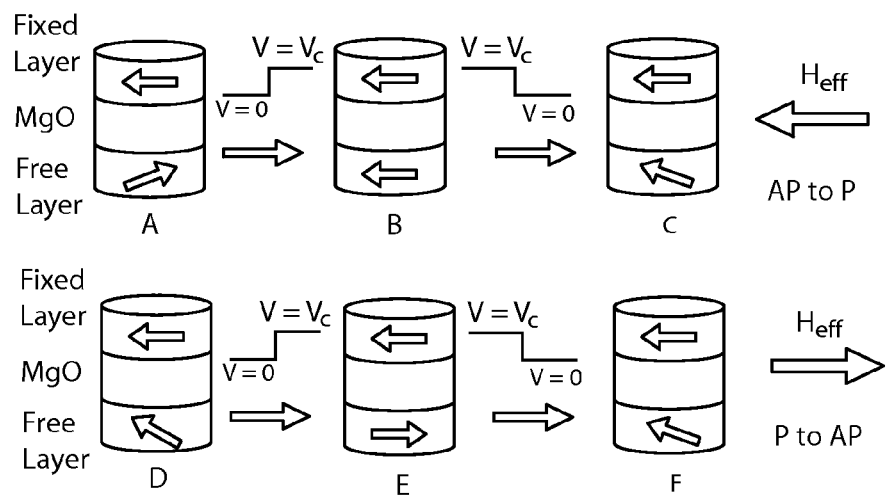
Figure 13A:
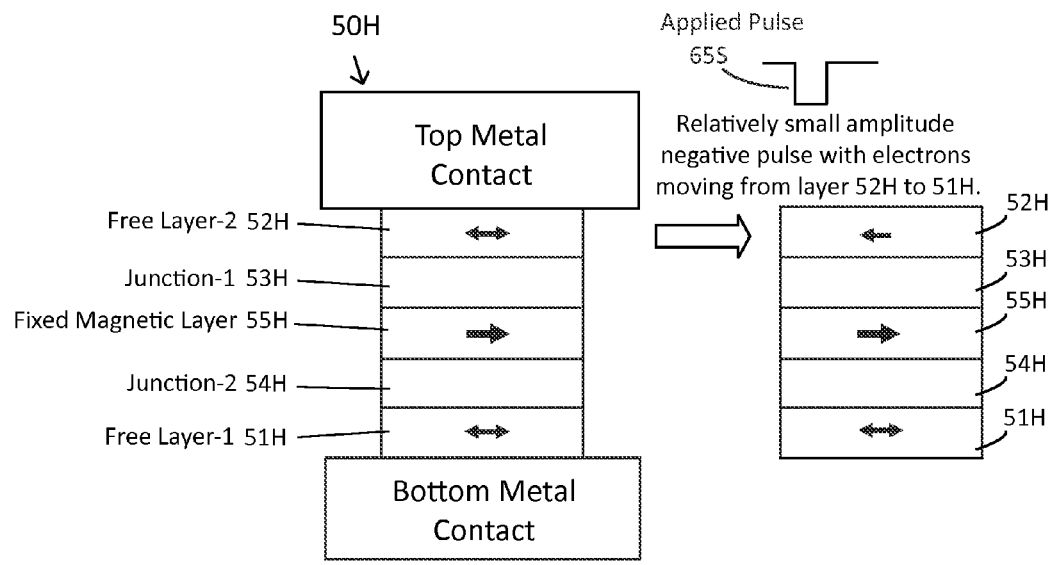
FIGS. 13A and 13B illustrate a method of switching the magnetization of free layer-2 in an MTJ layer structure embodiment of the invention with in-plane anisotropy.
Figure 13B:
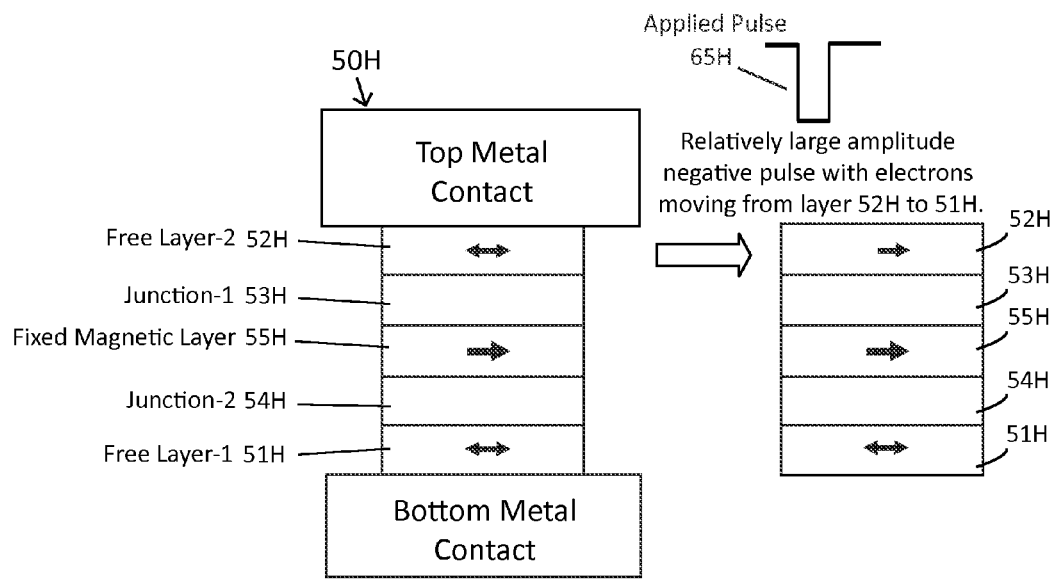

FIGS. 13A and 1B illustrate a method of switching the magnetization of free layer-2 52H in an MTJ layer structure embodiment of the invention 50H with in-plane anisotropy. Selectively switching free layer-2 52H only is achieved by applying a negative voltage pulse which causes electrons to move from free layer-2 52H to free layer-1 51H, the coercivity of layer 51H is enhanced, therefore it is more stable and harder to switch. At the same time the coercivity of layer 52H is reduced, therefore it is easier to switch. Applying a relatively small amplitude negative pulse 65S will switch the free layer-2 52H to the anti-parallel direction with respect to fixed magnetic layer 55H as illustrated in FIG. 13A. Applying a relatively large amplitude negative pulse 65H will cause the free layer-2 52H to switch to parallel the magnetization direction of fixed magnetic layer 55H as illustrated in FIG. 13B.

Although the present invention has been described in terms of specific embodiments, it is anticipated that alterations and modifications thereof will no doubt be apparent to those skilled in the art. It is therefore intended that the following claims be interpreted as covering all such alterations and modifications as fall within the true spirit and scope of the invention.

The invention claimed is:

1. A magnetic tunnel junction (MTJ) cell comprising:
   a first sub-MTJ structure including a first free layer having a voltage switchable magnetization state, a first junction layer and a shared fixed layer, and having high or low resistance depending on the first free layer's magnetization state; and
   a second sub-MTJ structure including a second free layer having a voltage switchable magnetization state, a second junction layer, and the shared fixed layer, and having high or low resistance depending on the second free layer's magnetization state;

wherein the high or low resistance of the first and second sub-MTJ structures are independently switchable, the first and second sub-MTJ structures are arranged in series, and the MTJ cell has three or more resistance states resulting from a series combination of resistance of first and second sub-MTJ structures.

2. The MTJ cell of claim 1 the first and second sub-MTJ structures have equal high and low resistance values and the MTJ cell has three discrete resistance states.

3. The MTJ cell of claim 1 the first and second sub-MTJ structures have unequal high or low resistance values and the MTJ cell has four discrete resistance states.

4. The MTJ cell of claim 1 wherein polarity and amplitude of selected voltage pulses applied to the MTJ cell selectively set the first or second sub-MTJ structures in high or low resistance state.

5. The MTJ cell of claim 1 wherein application of a selected voltage pulse having a predetermined amplitude and polarity sets one of the first or second sub-MTJ structures in high or low resistance state.

6. The MTJ cell of claim 1 wherein application of a selected voltage pulse having a predetermined amplitude and polarity switches the high or low resistance of one of the first or second sub-MTJ structures by accumulating electrons at a junction interface while leaving the high or low resistance of one of the first or second sub-MTJ structures unchanged.

7. The MTJ cell of claim 1 wherein the three or more resistance states of the MTJ cell are set by applying sequences of voltage pulse to the MTJ cell and the voltage pulse are selected from a set of four types of voltage pulses with two types of pulses having positive polarity and two types of pulses having negative polarity.

8. The MTJ cell of claim 1 wherein the first sub-MTJ structure is set to high resistance by applying a positive voltage pulse having a first amplitude to the MTJ cell, and the first sub-MTJ structure is set to low resistance by applying a positive voltage pulse having a second amplitude to the MTJ cell.

9. The MTJ cell of claim 1 wherein the second sub-MTJ structure is set to high resistance by applying a negative voltage pulse having a first amplitude to the MTJ cell, and the second sub-MTJ structure is set to low resistance by applying a negative voltage pulse having a second amplitude to the MTJ cell.

10. A logic device comprising:
a plurality magnetic tunnel junction (MTJ) cells including first and second sub-MTJ structures having a switchable high or low resistance mapped to an input bit value, the first and second sub-MTJ structures being arranged in series so that each MTJ cell has three or more resistance states;

input circuitry that writes two input bit values into a selected MTJ cell by setting the high or low resistance of first and second sub-MTJ structures; and output circuitry that determines a result of a logical operation on the two input bit values by determining a current resistance state of each MTJ cell.

11. The logic device of claim 10 wherein each MTJ cell has three resistance states and each resistance state is mapped into an output bit value.

12. The logic device of claim 10 wherein each MTJ cell has four resistance states and each resistance state is mapped into an output bit value.

13. A method of operating a logic device having a plurality magnetic tunnel junction (MTJ) cells with first and second sub-MTJ structures arranged in series comprising:

applying a first voltage pulse to a selected MTJ cell, the first voltage pulse having a positive polarity and selected amplitude to set the first sub-MTJ structure in high or low resistance state corresponding to a first input bit value;

applying a second voltage pulse to the selected MTJ cell, the second voltage pulse having a negative polarity and selected amplitude to set the second sub-MTJ structure in high or low resistance state corresponding to a second input bit value; and reading a current resistance state of selected MTJ cell to determine an output value for a logical operation on first and second input bit values.

14. The method of claim 13 wherein the MTJ cells have three or more resistance states that are determined by series resistance of first and second sub-MTJ structures and the output value for a logical operation is determined by mapping the current resistance state of the selected MTJ cell into an output bit value.

15. The method of claim 14 wherein applying a first voltage pulse further comprises selecting a first amplitude to set the first sub-MTJ structure in high resistance state and selecting a second amplitude to set the first sub-MTJ structure in low resistance state.

16. The method claim 13 wherein applying a first voltage pulse switches to the high or low resistance of the first sub-MTJ structure by accumulating electrons at a junction in the first sub-MTJ structure while leaving the high or low resistance of the second sub-MTJ structure unchanged.

17. The method claim 16 wherein accumulating electrons at the junction reduces magnetic anisotropy of the free layer of the first sub-MTJ structure.

* * * * *